(12) United States Patent
Barboza et al.

(10) Patent No.: US 7,878,116 B2
(45) Date of Patent: Feb. 1, 2011

(54) METHODS AND APPARATUS FOR ENGAGING WEB-MATERIAL CORES

(75) Inventors: Joseph Barboza, Westport, MA (US); James Lynch, Uxbridge, MA (US); Mark E. Rossmeisl, Franklin, MA (US)

(73) Assignee: Illinois Tool Works Inc., Glenview, IL (US)

(*) Notice: Subject to any disclaimer, the term of this patent is extended or adjusted under 35 U.S.C. 154(b) by 728 days.

(21) Appl. No.: 11/725,171

(22) Filed: Mar. 16, 2007

(65) Prior Publication Data
US 2008/0223233 A1 Sep. 18, 2008

(51) Int. Cl.
B41L 13/00 (2006.01)

(52) U.S. Cl. .......... 101/118; 242/571.6; 242/573.1

(58) Field of Classification Search .......... 101/114, 101/123, 129, 116–118; 242/396, 396.1, 242/396.2, 396.5, 396.6, 410, 412.1, 571.6, 242/571.7, 573.1
See application file for complete search history.

(56) References Cited

U.S. PATENT DOCUMENTS

| | | | |
|---|---|---|---|
| 2,381,301 A | 8/1945 | Markle, Jr. | |
| 3,387,799 A | 6/1968 | Wilson | |
| 3,445,076 A | 5/1969 | Dalglish | |
| 4,158,446 A * | 6/1979 | Blake | 242/571.7 |
| 4,310,131 A * | 1/1982 | Althuber et al. | 242/412.1 |
| 5,297,750 A * | 3/1994 | Hunt | 242/422.4 |
| 5,460,339 A * | 10/1995 | Drew | 242/572 |
| 5,492,280 A * | 2/1996 | Corres et al. | 242/130 |
| 5,725,321 A * | 3/1998 | Brannan et al. | 400/708 |
| 5,918,544 A | 7/1999 | Doyle | |
| 6,626,106 B2 | 9/2003 | Peckham et al. | |
| 6,684,765 B1 | 2/2004 | Rajathuray et al. | |
| 6,955,121 B2 | 10/2005 | Perault et al. | |
| 7,017,489 B2 | 3/2006 | Perault et al. | |
| 7,040,228 B2 | 5/2006 | Perault et al. | |
| 2003/0116675 A1 | 6/2003 | Heuser | |
| 2005/0183600 A1 | 8/2005 | Perault et al. | |

FOREIGN PATENT DOCUMENTS

GB 1 319 944 A 6/1973

OTHER PUBLICATIONS

International Search Report for PCT/US2008/054099 mailed Jun. 26, 2008.

* cited by examiner

Primary Examiner—Ren Yan
(74) Attorney, Agent, or Firm—Lando & Anastasi, LLP

(57) ABSTRACT

A stencil printer apparatus is provided. The stencil printer apparatus may include a stencil, a material applicator to apply material on the stencil, a supply roller configured to receive a roll of web-material, the supply roller comprising a first shaft, a take-up roller to receive a roll of web-material, the take-up roller comprising a second shaft, at least one spring-loaded protrusion element associated with one of the first shaft and the second shaft, and a drive configured to move web-material across the stencil between the supply roller and the take-up roller, and a frame to support the supply roller, the take-up roller and the drive. The at least one spring-loaded protrusion element may be configured and arranged on the at least one of the first shaft and the second shaft to resiliently engage at least one web-material core around which web-material may be disposed. Other embodiments and methods ate provided.

6 Claims, 8 Drawing Sheets

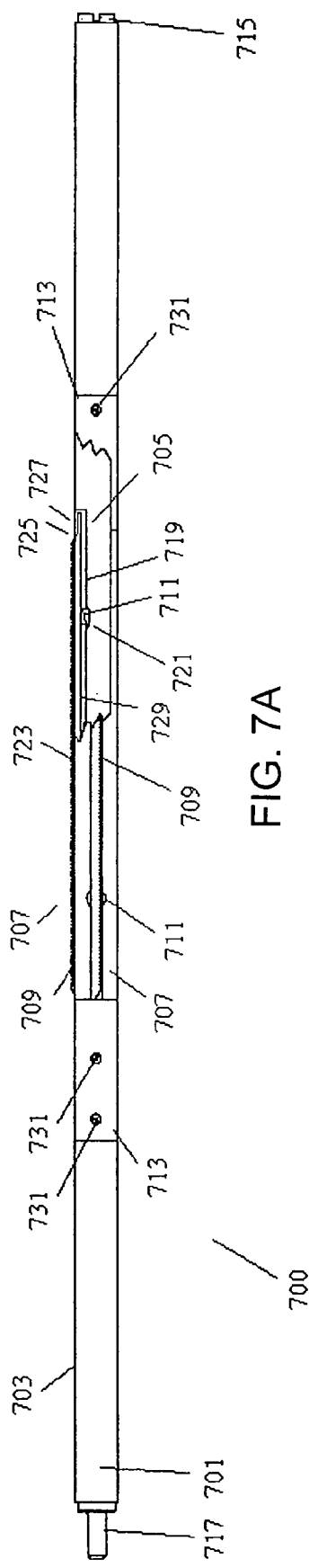
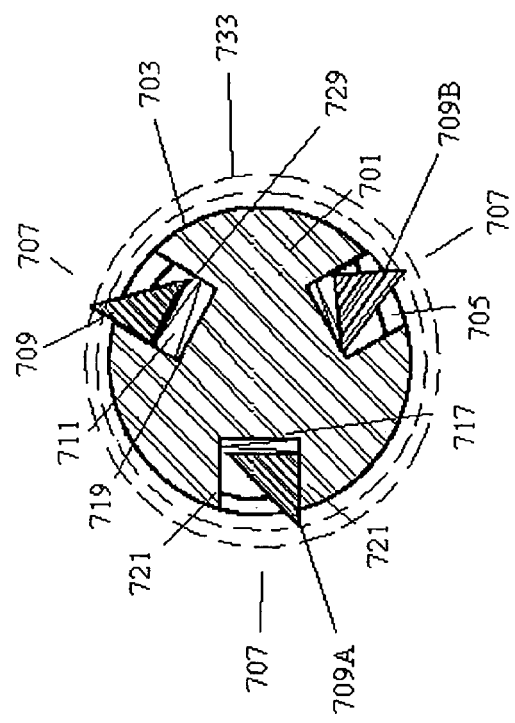
FIG. 7A
FIG. 7B

METHODS AND APPARATUS FOR ENGAGING WEB-MATERIAL CORES

BACKGROUND OF INVENTION

1. Field of Invention

The invention relates generally to stencil cleaning methods and apparatus, and more particularly to a stencil printer having at least one web-material roller.

2. Discussion of Related Art

In a typical surface-mount circuit board manufacturing operation, a stencil printer is used to print solder paste onto a circuit board having a pattern of pads or some other conductive surface onto which solder paste may be deposited. The circuit board is automatically fed into the stencil printer and one or more small holes or marks on the circuit board, called fiducials, may be used to properly align the circuit board with the stencil or screen of the stencil printer prior to the printing of solder paste onto the circuit board. Once a circuit board has been properly aligned with the stencil in the printer, the circuit board may be raised to the stencil (or the stencil may be lowered to the circuit board), solder paste may be dispensed onto the stencil from a standard solder paste cartridge, and a wiper blade or squeegee may traverse the stencil to force the solder paste through apertures formed in the stencil and thereby onto the circuit board. As the squeegee is moved across the stencil, the solder paste tends to roll in front of the blade, which desirably causes mixing and shearing of the solder paste so as to attain desired viscosity to facilitate filling of the apertures in the screen or stencil.

In some prior art stencil printers, any excess solder paste remaining under the squeegee after it has fully traversed the stencil, remains on the stencil when the squeegee is returned to its initial position for printing on a subsequent circuit board. In some instances, as the squeegee passes the solder paste over the apertures when returning to its initial position, minute amounts of solder paste may seep through the apertures to accumulate at the bottom side of the stencil. This presents various problems such as the solder paste being inadvertently disposed on the unintended areas of the circuit boards. Also, as the solder paste hardens, it complicates the alignment procedure of a circuit board with the stencil. Also, such hardened solder paste may jeopardize the quality of subsequent printing operations. Therefore, it is highly desirable to remove the excess solder paste that forms on the bottom of the stencil.

U.S. Pat. No. 5,918,544 to Doyle represents one prior art stencil printer having a well-known method and apparatus for cleaning the bottom of the stencil. Doyle discloses a wiping system that is positioned near the vicinity of the stencil and moves beneath the stencil from one end of the stencil to the other end. As the stencil wiper system moves beneath the stencil, it wipes off excess solder paste at the bottom of the stencil.

FIGS. 1 and 2 disclose such a prior art stencil wiper system, generally indicated at 100. As shown, a paper supply of a prior art stencil wiper system 100 includes a roll of paper 101 housed on a supply roller 103, several paper guide rollers 201, a take-up roller 105 for receiving used paper, and a paper driver 107 for moving the paper across the stencil in a linear direction from the supply roller 103 to the take-up roller 105. In one embodiment, the stencil wiper system 100 further includes a hollow solvent tube 109 with numerous small openings formed along the length of the tube 109, and a wiper blade 203 having a vacuum plenum 205 for removing excess moisture and hardened solder paste from the paper as it travels underneath the stencil. The wiper blade 203 moves the web between a position in which the paper is spaced away from the stencil and a position in which the paper engages the stencil. During a cleaning operation, a paper winder motor of the paper driver 107 rotates the take-up roller 105 (and paper supply roller 103), which passes paper through the paper guide rollers 201. Between the paper guide rollers 201 there is the hollow solvent tube 109 that is filled with solvent by a solvent pump, which causes the solvent tube 109 to squirt solvent through its numerous holes onto the paper as it passes the solvent tube 109. The solvent impregnated paper is passed over the wiper blade 203, which holds the paper in place as the stencil moves over the paper, thereby cleaning the stencil.

Changing paper rolls and cores for disposal of used paper can be a difficult process. In particular, paper is typically supplied wrapped around a cardboard core (e.g., a tube) that is placed around the supply roller 103. After the paper is used, the paper is wrapped around another cardboard core engaged to the take-up roller 105. To provide a stable supply of paper without damaging the core or the paper, the cores (i.e., the core of the supply roll and the core on the take-up roller) may be sized to fit firmly around the respective roller. A single roller may have difficulty securely engaging cores having slightly different sizes due to manufacturing differences.

SUMMARY OF INVENTION

Embodiments of the invention provide improvements to stencil wiper systems, such as those described above.

One aspect of the invention includes a stencil printer. In some embodiments the stencil printer comprises a stencil, a material applicator to apply material on the stencil, a supply roller configured to receive a roll of web-material, the supply roller comprising a first shaft, a take-up roller to receive used web-material, the take-up roller comprising a second shaft, at least one spring-loaded protrusion element associated with one of the first shaft and the second shaft, the at least one spring-loaded protrusion element being configured and arranged on the at least one of the first shaft and the second shaft to resiliently engage at least one web-material core around which web-material may be disposed, a drive configured to move web-material across the stencil between the supply roller and the take-up roller, and a frame to support the supply roller, the take-up roller and the drive.

In some embodiments, the web-material includes a paper. In some embodiments, the at least one spring-loaded protrusion element includes at least one spur and at least one spring. In some embodiments, the at least one spring-loaded protrusion element is configured to resiliently engage the at least one web-material core by penetrating at least a portion of an interior of the at least one web-material core with at least a part of the at least one spur. In some embodiments, the at least one spur includes a serrated engagement portion. In some embodiments, the at least one spur is configured to rotate in a first direction to increase a force exerted to resiliently engage the web-material core when the at least one of the first shaft and the second shaft is rotated in at least one second direction.

In some embodiments, the at least one spring is arranged to exert a force on the at least one spur away from a center of the at least one of the first shaft and the second shaft. In some implementations, the at least one of the first shaft and the second shaft includes at least one cylindrical surface, and the at least one spur is configured to extend beyond the at least one cylindrical surface. In some implementations, the at least one spur and the at least one spring are arranged so that the at least one spring may be compressed toward the center of the at least one of the first shaft and the second shaft to decrease an effective diameter of the at least one cylindrical surface. In some embodiments, the at least one spur includes at least one taper portion. In some embodiments, the at least one spur includes a plurality of spurs. In some embodiments, the at least one spring includes a plurality of springs. In some embodiments, the at least one of the first shaft and the second shaft includes both the first shaft and the second shaft.

Another aspect of the invention includes a web-material roller. In some embodiments, the web-material roller comprises a shaft configured to rotate around an axis, and at least one spring-loaded protrusion element configured and arranged on the shaft to resiliently engage a web-material core.

In some embodiments, the web-material core includes a cardboard core. In some embodiments, the spring-loaded protrusion element includes at least one spur and a least one spring. In some embodiments, the spring-loaded protrusion element is configured to resiliently engage the web-material core by penetrating at least a portion of an interior of the web-material core with at least a part of the at least one spur. In some embodiments, the at least one spur includes a serrated engagement portion. In some embodiments, the at least one spur is configured to rotate in a first direction to increase a force exerted to resiliently engage the web-material core when the shaft is rotated in at least one second direction.

In some embodiments, the at least one spring is arranged to exert force on the at least one spur away from a center of the shaft. In some implementations, the shaft includes at least one cylindrical surface, and the at least one spur is configured to extend beyond the at least one cylindrical surface. In some implementations, the at least one spur and the at least one spring are arranged so that the at least one spring may be compressed toward the center of the shaft to decrease an effective diameter of the cylindrical surface. In some embodiments, the at least one spur includes at least one taper portion arranged towards an end of the shaft. In some embodiments, the at least one spur includes a plurality of spurs. In some embodiments, the at least one spring includes a plurality of springs.

Some embodiments of the invention include a stencil printer comprising a stencil, a material applicator to apply material on the stencil, a web-material roller as described above, a drive to move paper across the stencil, and a frame to support the web-material roller and the drive. In some embodiments, the web-material roller includes at least one of a take-up roller and a supply roller.

Yet another aspect of the invention includes a web-material roller. In some embodiments, the web material roller includes a shaft configured to rotate around an axis, and a means configured and arranged on the shaft for resiliently engaging a web-material core.

In some embodiments, the web-material core includes a cardboard core. In some embodiments, the means includes at least one spring-loaded means. In some embodiments, the at least one spring-loaded means includes at least one spring-loaded spur. In some embodiments, the at least one spring-loaded spur is configured to rotate in a first direction to increase a force exerted to resiliently engage the web-material core when the shaft is rotated in at least one second direction.

In some embodiments, the shaft includes at least one cylindrical surface, and at least one portion of the means is configured to extend beyond the at least one cylindrical surface. In some implementations, the at least a portion of the means is configured to compress toward a center of the shaft to decrease an effective diameter of the at least one cylindrical surface. In some embodiments, the means includes at least one taper portion arranged towards an end of the shaft. Some embodiments of the invention include a stencil printer comprising a stencil, a material applicator to apply material on the stencil, a web-material roller described above, a drive to move paper across the stencil, and a frame to support the web-material roller and the drive. In some embodiments, the web-material roller includes at least one of a take-up roller and a supply roller.

Still another aspect of the invention includes a method of disposing a web-material around a web-material roller. In some embodiments, the method comprises resiliently engaging at least one web-material core around at least one of a take-up roller and a supply roller with at least one spring-loaded protrusion element arranged on at least one shaft of the at least one of the supply roller and the take-up roller, and rotating the supply roller and rotating the take-up roller so that the web-material moves from the supply roller to the take-up roller.

In some embodiments, the web-material includes a paper. In some embodiments, the at least one web-material core includes a cardboard core. In some embodiments, resiliently engaging includes compressing the at least one protrusion element. In some embodiments, resiliently engaging includes penetrating at least a portion of an interior of the at least one web-material core. Some embodiments further comprise disengaging the at least one web-material core. In some embodiments, disengaging includes rotating the web-material core to decrease a force exerted on the web-material core. In some embodiments, the at least one of the supply roller and the take-up roller includes both the supply roller and the take-up roller. Some embodiments further comprise cleaning at least one stencil using the web-material.

A still further aspect of the invention includes a method of changing a web-material core on a shaft of a web-material roller. In some embodiments, the method comprises rotating a first web-material core in a first direction with respect to the shaft, axially removing the first web-material core from the shaft, axially applying a second web-material core to the shaft, and rotating the second web-material core in a second direction with respect to the shaft.

In some embodiments, rotating the first web-material core includes decompressing at least one spring of a spring-loaded protrusion element coupled to the shaft. In some embodiments, rotating the second web-material core includes compressing at least one spring of a spring-loaded protrusion element coupled to the shaft. In some embodiments, at least one of the first web-material core and the second web-material core includes a cardboard web-material core.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIGS. 7A and 7B show two views of a web-material roller in accordance with some embodiments of the invention.

DETAILED DESCRIPTION

Figure 1:
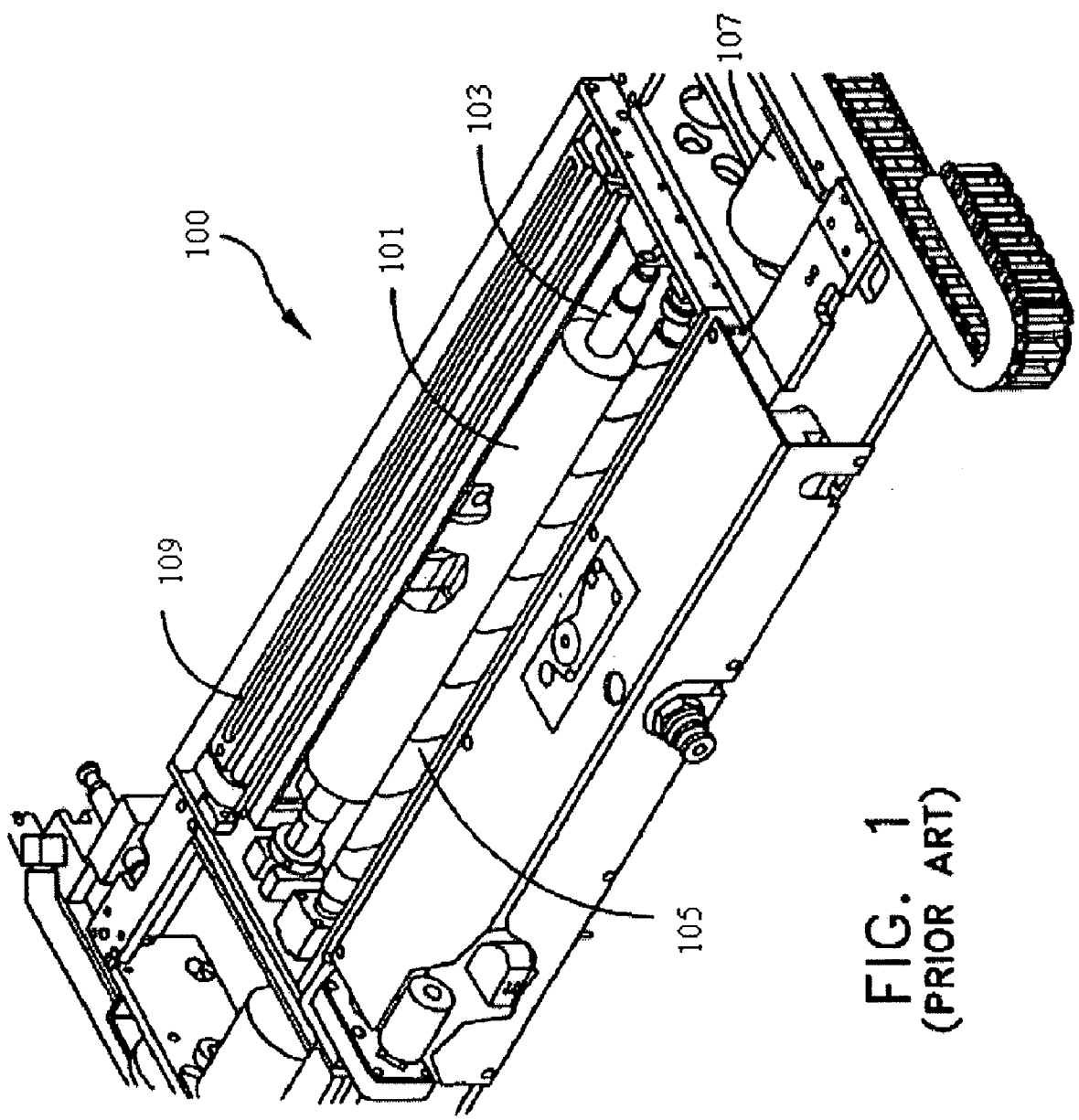
FIG. 1 shows perspective view of a prior art stencil wiper apparatus.
Figure 2:
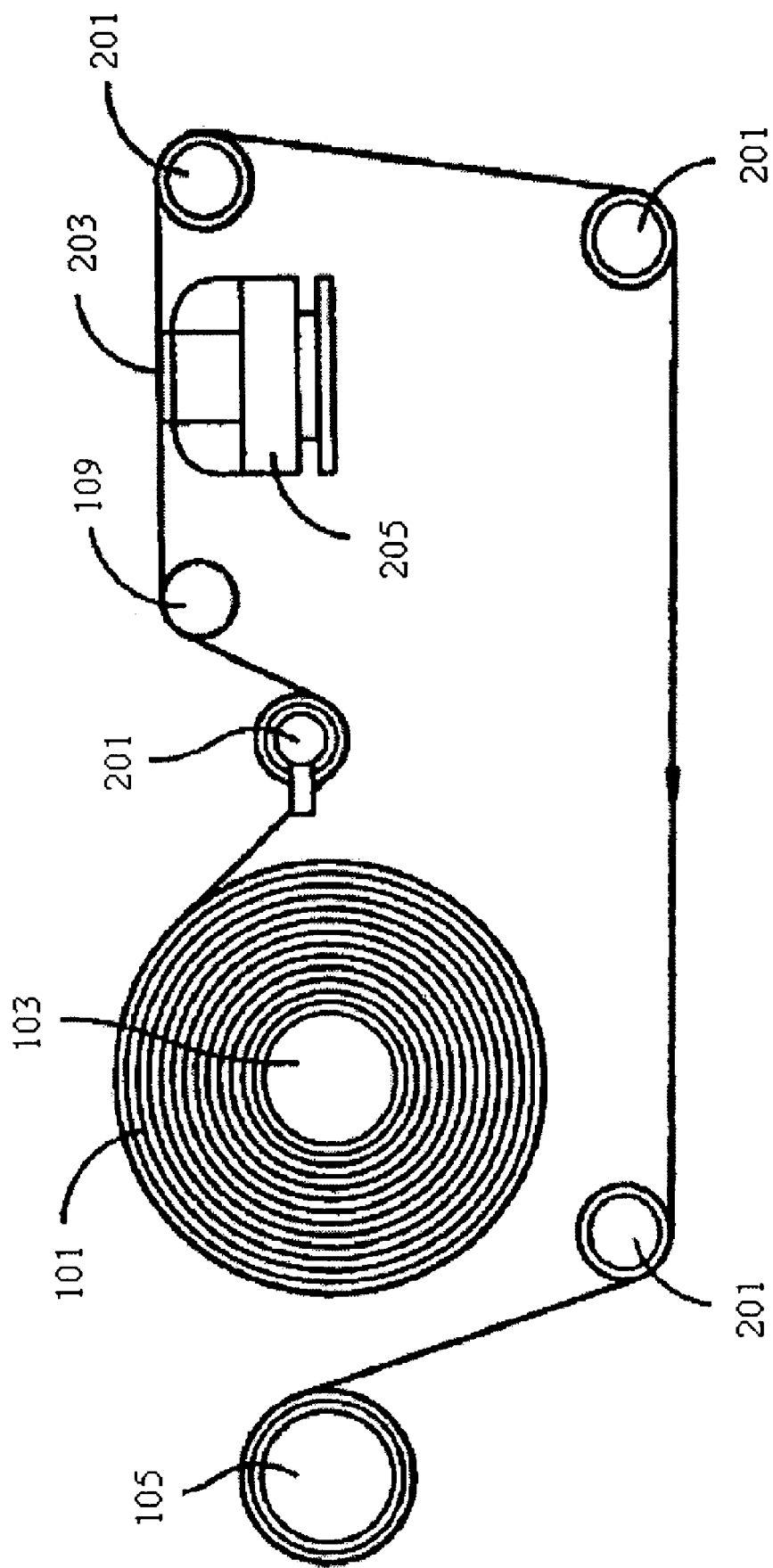
FIG. 2 shows a diagrammatic representation of the prior art stencil wiper apparatus illustrated in FIG. 1.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

For purposes of illustration, embodiments of the invention will now be described with reference to a stencil printer used to print solder paste onto a circuit board. One skilled in the art will appreciate, however, that embodiments of the invention are not limited to stencil printers that print solder paste onto circuit boards, but rather, may be used in other applications requiring dispensing of other viscous materials, such as glues and encapsulents. Further, stencil printers in accordance with embodiments of the invention are not limited to those that print solder paste on circuit boards, but rather, include those used for printing other materials on a variety of substrates. Also, the terms screen and stencil may be used interchangeably herein to describe a device in a printer that defines a pattern to be printed onto a substrate.

Figure 3:
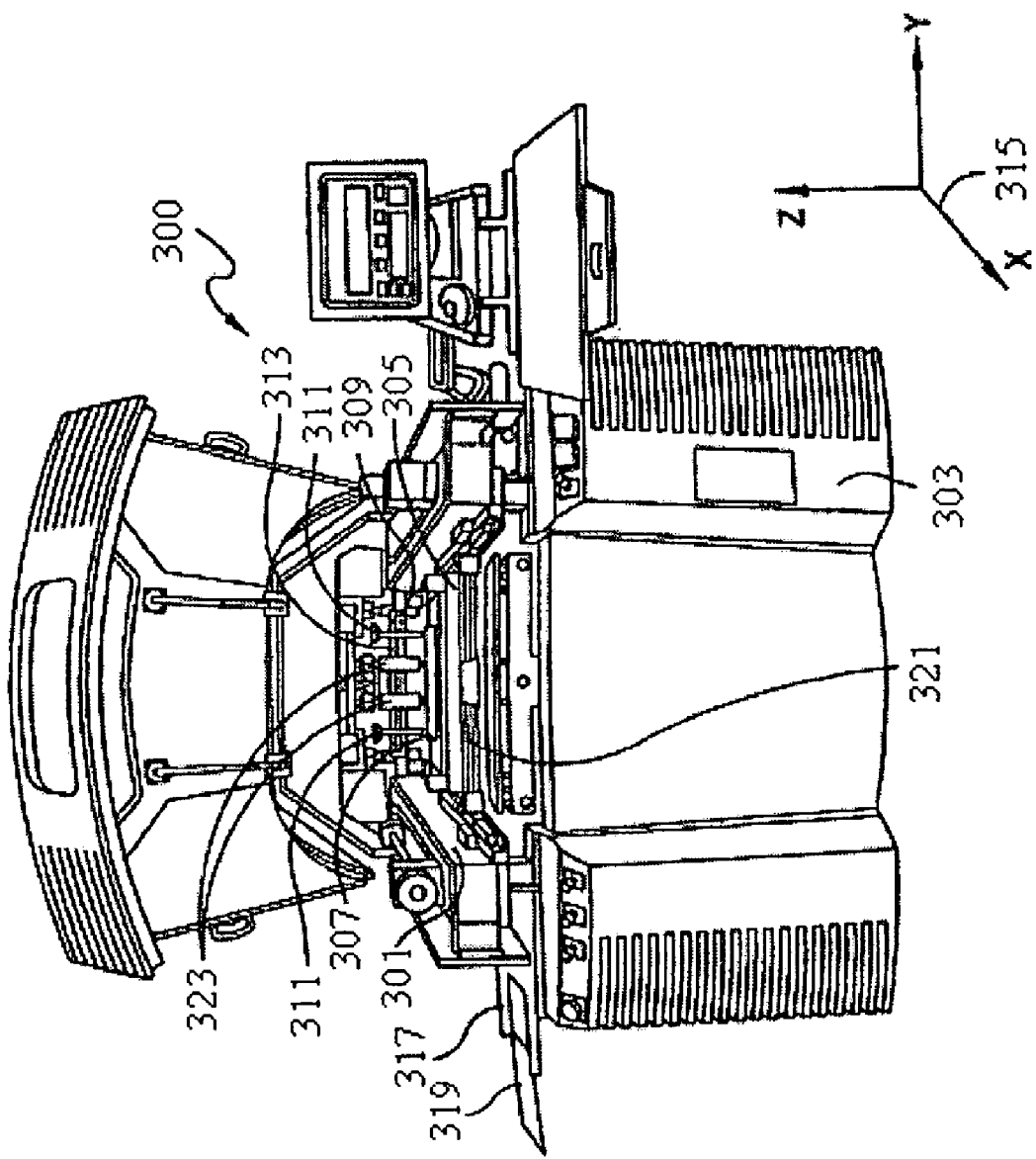
FIG. 3 shows a front perspective view of a stencil printer in accordance with some embodiments of the invention.

FIG. 3 shows an example stencil printer, generally indicated at 300, which includes a frame 301 that supports components of the stencil printer 300. In some embodiments, the components may include a controller 303, a stencil 305, and a dispensing head 307 having a dispensing slot from which solder paste may be dispensed. The dispensing head 307 may be coupled to a first plate 309 using two thumbscrews, each indicated at 311. The first plate 309 may be coupled to a second plate 313 which may be coupled to the frame 301 of the stencil printer 300. The first plate 309 may be coupled to the second plate 313 in such a manner that the first plate 309 can be moved with respect to the second plate 313 along a z axis, the z axis being defined by the coordinate axis system indicated at 315. The first plate 309 may be moved by motors under the control of the controller 303.

The second plate 313 may be movably coupled to the frame 301 such that the second plate 313 can move with respect to the frame 301 along an x axis, the x axis also being defined by the coordinate axis system 315. As described below in further detail, the movements of the first and second plates 309, 313 may allow the dispensing head 307 to be placed over the stencil 305 and moved across the stencil 305 to allow printing of solder paste onto a circuit board. Other systems configured to move the dispensing head 307 over the stencil 305 may be employed.

Stencil printer 300 also may include a conveyor system having rails 317 for transporting a circuit board 319 to a printing position in the stencil printer 300. In some systems, the stencil printer 300 may have a support having a number of pins 321, positioned beneath the circuit board 319 when the circuit board 319 is in the dispensing position. The pins 321 may raise the circuit board 319 off of the rails 317 to place the circuit board 319 in contact with, or in close proximity to, the stencil 305 when printing is to occur.

In some embodiments, the dispensing head 307 may be configured to receive one or more solder paste cartridges 323 that may provide solder paste to the dispensing head 307 during a printing operation. For example, in some implementations, the solder paste cartridges may include two standard three ounce or six ounce solder paste cartridges. As readily understood by those skilled in the art, the dispensing head 307 could be configured to receive other standard, or non-standard, cartridges. Each of the solder paste cartridges 323 may be coupled to one end of a pneumatic air hose. The other end of each of the pneumatic air hoses may be attached to a compressor that under the control of the controller 303 provides pressurized air to the cartridges 323 to force solder paste to flow from the cartridges 323 into the dispensing head 307 and onto the stencil 305. Mechanical devices, such as a piston, may be used in addition to, or in place of, air pressure to force the solder paste from the cartridges 323 into the dispensing head 307. In some embodiments, the controller 303 may be implemented using a personal computer having a Microsoft DOS or Windows (e.g., Windows NT, Windows XP, Windows Vista), UNIX, LINUX, Mac, or other operating system with application specific software to control the operation of the stencil printer 300.

In some embodiments, the stencil printer 300 may operate as follows. A circuit board 319 may be loaded into the stencil printer 300 using the conveyor rails 317 and raised by the support to engage the stencil 305. The dispensing head 307 may then be lowered in the z direction until it is in contact with the stencil 305. Pressurized air may be provided to the cartridges 323 while the dispensing head 307 is moved in the x direction across the stencil 305. The pressurized air may force solder paste out of the cartridges 323, and may create pressure on the solder paste in the dispensing head 307, thereby forcing solder paste from the dispensing slot of the dispensing head 307 through apertures in the stencil 305 and onto the circuit board 319. Once the dispensing head 307 has fully traversed the stencil 305, the circuit board 319 may be lowered back onto the conveyor rails 317 and transported from the printer 300 so that a second circuit board may be loaded into the stencil printer 300. To print on the second circuit board, the dispensing head 307 may be moved across the stencil 305 in the direction opposite to that used for the first circuit board. Alternatively, a squeegee arm could swing in to contain the solder paste in the dispenser, and the dispenser can then be lifted in the z direction and moved back to its original position to prepare to print on the second circuit board using a similar direction stroke.

Figure 4:
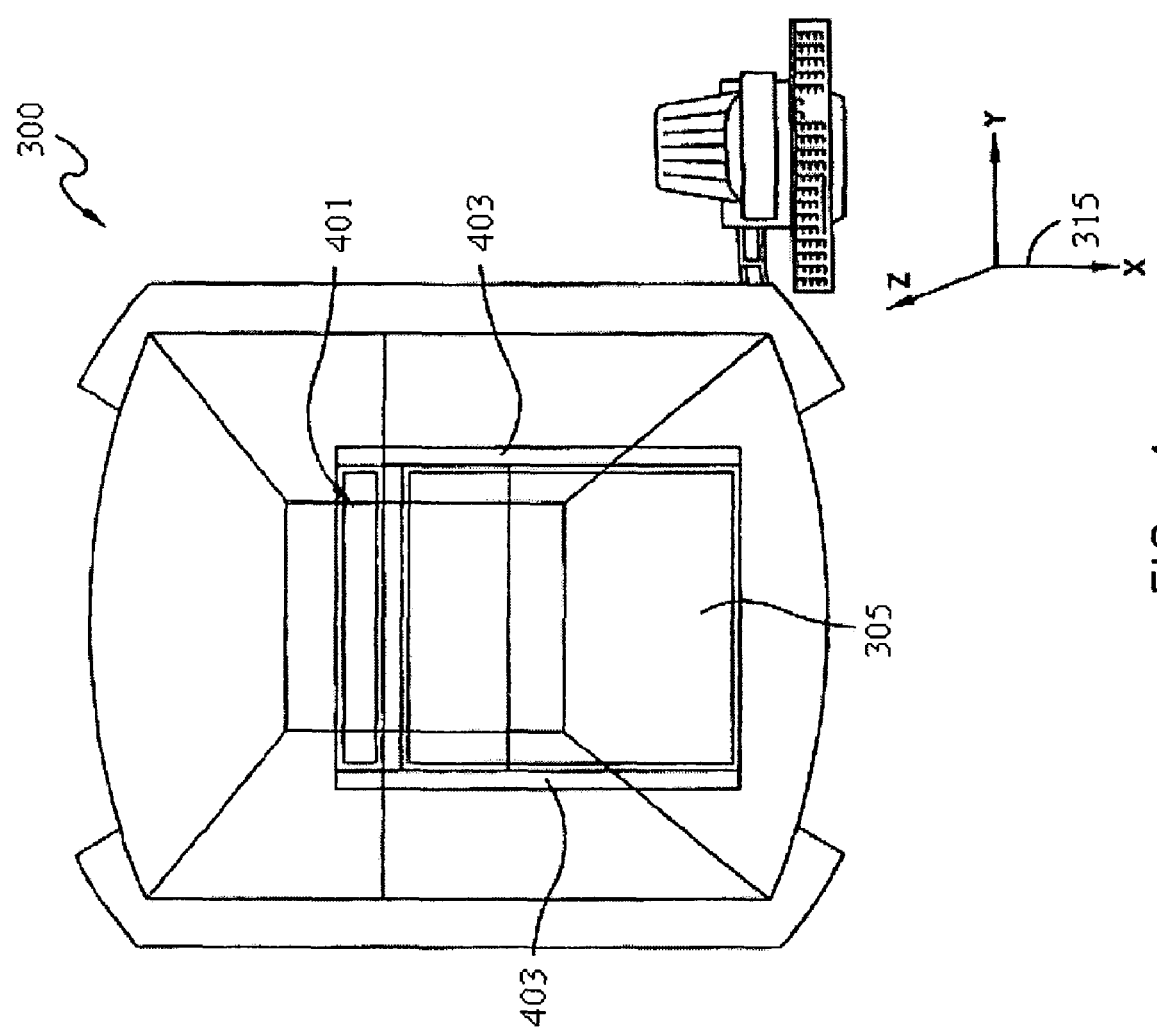
FIG. 4 shows a top plan view of the stencil printer illustrated in FIG. 3 showing a stencil wiper apparatus in accordance with an embodiment of the invention.

After one or more applications of the solder paste to circuit boards, excess solder paste may accumulate at the bottom of the stencil 305 and a stencil wiper assembly may move beneath the stencil 305 to remove the excess solder paste. In other embodiments, the stencil 305 may be moved over the stencil wiper assembly. FIG. 4 is a top view of the stencil printer 300 shown in FIG. 3 showing a stencil wiper assembly, generally indicated at 401, in accordance with some embodiments of the invention. The stencil wiper assembly 401 may be mounted on a pair of rails, each indicated at 403, and situated at one end of the stencil 305. According to one embodiment of the invention, the stencil wiper assembly 401 rides on linear rails 403 and may be moved back and forth using a rack and pinion mechanism. Alternatively, a motor and belt, mechanism may be used to reciprocate the stencil wiper assembly 401, as well as chain and pulley linear motor, or by an alternative mechanism. The stencil wiper assembly

401 may also stay stationary as the stencil 305 is moved over the assembly 401 to perform the cleaning operation.

Figure 5:
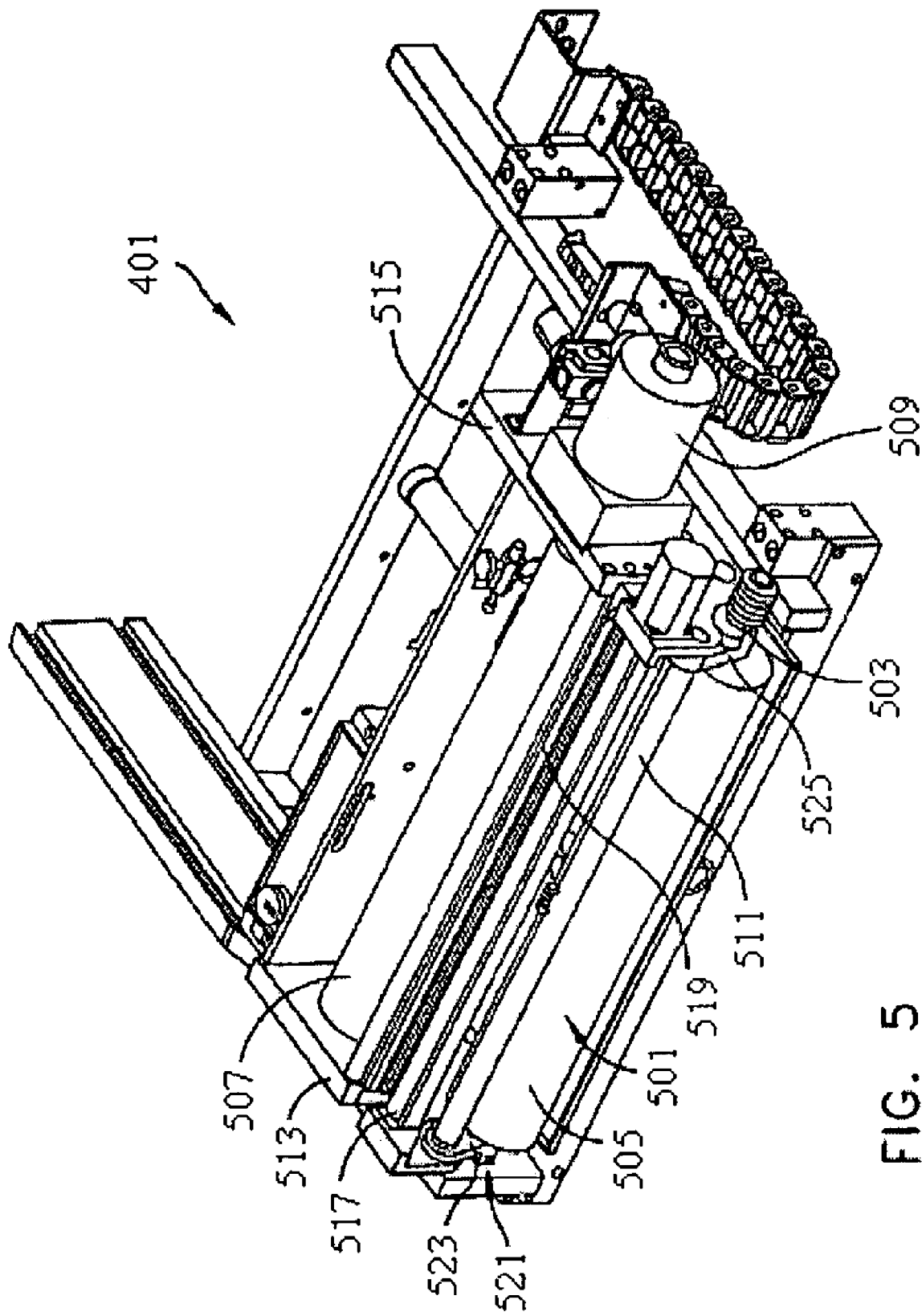
FIG. 5 shows a perspective view of the stencil wiper apparatus in accordance with some embodiments of the invention.
Figure 6:
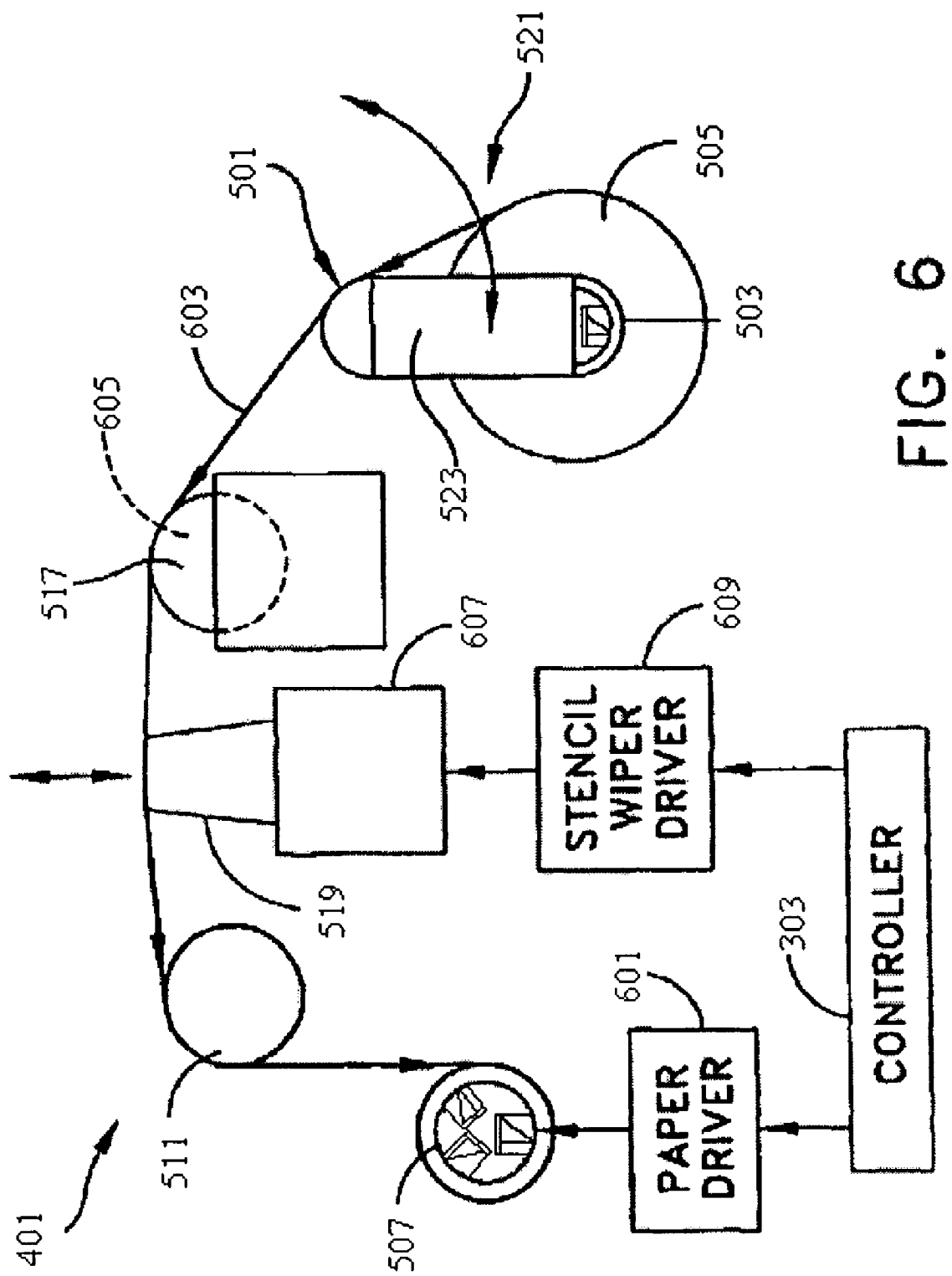
FIG. 6 shows a diagrammatic representation of the stencil wiper apparatus in accordance with some embodiments of the invention.

Referring to FIGS. 5 and 6, which show an example stencil wiper assembly in greater detail, there is generally indicated at 501 a web-material supply module of the invention for enabling an operator to quickly replace the web-material supply. As shown, the module 501 includes a supply roller 503 for receiving a roll of web-material 505 and a take-up roller 507 for receiving the used web-material after it cleans the underneath of the stencil 305. The supply roller 503 may be constructed and arranged to receive the roll of web-material 505 over the supply roller 503 in a secure position with respect to the supply roller 503, as described in more detail below. The roll of web-material 505 may be purchased from any vendor of such materials, such as from JNJ Industries, Inc. of Franklin, Mass. The roll of web-material may include a web-material core (e.g., a cardboard tube) around which a supply of web-material may be wrapped. An empty web-material core may be initially placed around the take-up roller so that used web-material may be wrapped around the core for disposal. In some implementations, the web-material initially may be dispose between the supply roller 503 and take-up roller 507 and affixed to the take-up roller 507 using a tape. It should be understood that web-material may include any material used to wipe the stencil, including paper.

A web-material winder motor 509 having a web-material driver 601 may be mechanically connected to the take-up roller 507 to rotate the take-up roller 507 in the direction depicted by arrows 603 in FIG. 6. In some embodiments, the web-material driver 601 may communicate with the controller 303 of the stencil printer 300 to move web-material from the supply roller 503 to the take-up roller 507 over at least one guide roller 511. In some embodiments, a pair of frame members 513, 515 are further provided to support the various components of the web-material supply module 501 in the manner illustrated in FIG. 5. It should be noted that in FIG. 5 the web-material is not shown to extend over the guide roller 511 as well as other components of the stencil wiper assembly 401 to more clearly illustrate these components.

In some embodiments, the stencil wiper assembly 401 may further include a fluid delivery assembly embodying a hollow solvent tube 517 with numerous small openings 605 formed along the length of the tube 517 for wetting the web-material. A wiper blade 519 having a vacuum plenum 607 may be further provided for removing excess moisture and hardened solder paste from the web-material as it travels underneath the stencil. As shown, the guide roller 511 may be positioned between the wiper blade 519 and the take-up roller 507. The stencil wiper assembly 401 may be designed to move the wiper blade 519 between a non-engaged position in which the web-material is spaced away from the stencil 305 to an engaged position in which the wiper blade 519 forces the web-material upwards to engage the stencil 305 for cleaning the stencil. The controller 303 may send a signal to a stencil wiper driver 609 to move the stencil wiper 519 and/or vacuum plenum 607 to engaged and non-engaged positions. During a cleaning operation, the web-material winder motor 509 may rotate the web-material supply roller 503 by driving the take-up roller 507. The web-material may pass over the solvent tube 517, which is filled with solvent by a solvent pump (not shown). The release of solvent on the web-material may be achieved by providing solvent under pressure within the solvent tube 517, which causes the solvent tube to squirt solvent through its numerous holes 605 onto the web-material as it passes the solvent tube. Another approach to wetting the web-material is by providing a cylindrical structure that rotates within a solvent bath to wet the web-material as it travels over the cylindrical structure. In some embodiments, the solvent impregnated web-material may be passed over the wiper blade 519, which holds the web-material in place as the stencil wiper assembly 401 moves underneath the stencil 305 or as the stencil 305 moves over the stencil wiper assembly 401, as the case may be, thereby cleaning the stencil 305.

Detailed descriptions of the operation of example fluid delivery assembly (i.e., the hollow solvent tube 517) and the example vacuum plenum 607 can be found in U.S. Pat. No. 7,040,228 entitled SELF-CONTAINED VACUUM MODULE FOR STENCIL WIPER ASSEMBLY to Perault, et al., filed on Feb. 20, 2004, and U.S. Pat. No. 6,955,121 entitled METHODS AND APPARATUS FOR CLEANING A STENCIL to Perault, et al., filed on Feb. 20, 2004, both of with are hereby incorporated herein by reference. It should be understood that the invention is not limited to embodiments using such an exemplary fluid delivery assembly and vacuum plenum 607.

In one embodiment, the web-material supply module 501 may include a pivot mechanism, generally indicated at 521, for pivoting the supply roller 503 between its operating and changing positions. Specifically, the pivot mechanism 521 may include at least one and preferably a pair of arms 523, 525 that enable the pivot action of the supply roller 503. One end of each pivot arm 523 may be rotatably attached to the supply roller 503 in any suitable manner, e.g., bearings, at the end of the supply roller 503. The other (opposite) end of each pivot arm 523, 525 may be pivotably attached to its respective frame member 513, 515 in a similar manner. As shown in FIGS. 5 and 6, during operation of the stencil wiper assembly 401 to clean a stencil 305, the supply roller 503 is disposed below the guide roller 511, solvent tube 517 and stencil wiper 519. In this position, it is difficult, if not impossible, to replace an existing, used-up roll of web-material 505 with a new roll of web-material. When depleted, the supply roller 503 can be pivoted counterclockwise into a changing position (not shown). This reduces cycle time as well as the frustration level of the operator having to replace the roll of web-material 505. The movement of supply roller 503 between a use position and a change position is described in U.S. Pat. No. 7,017,489 to Perault, et al., entitled METHODS AND APPARATUS FOR CHANGING WEB MATERIAL IN A STENCIL PRINTER, and filed Feb. 20, 2004, which is hereby incorporated herein by reference. It should be understood that the invention is not limited to any particular construction or arrangement of a wiper assembly or stencil printer and that the above descriptions are given as examples only.

Figure 8:
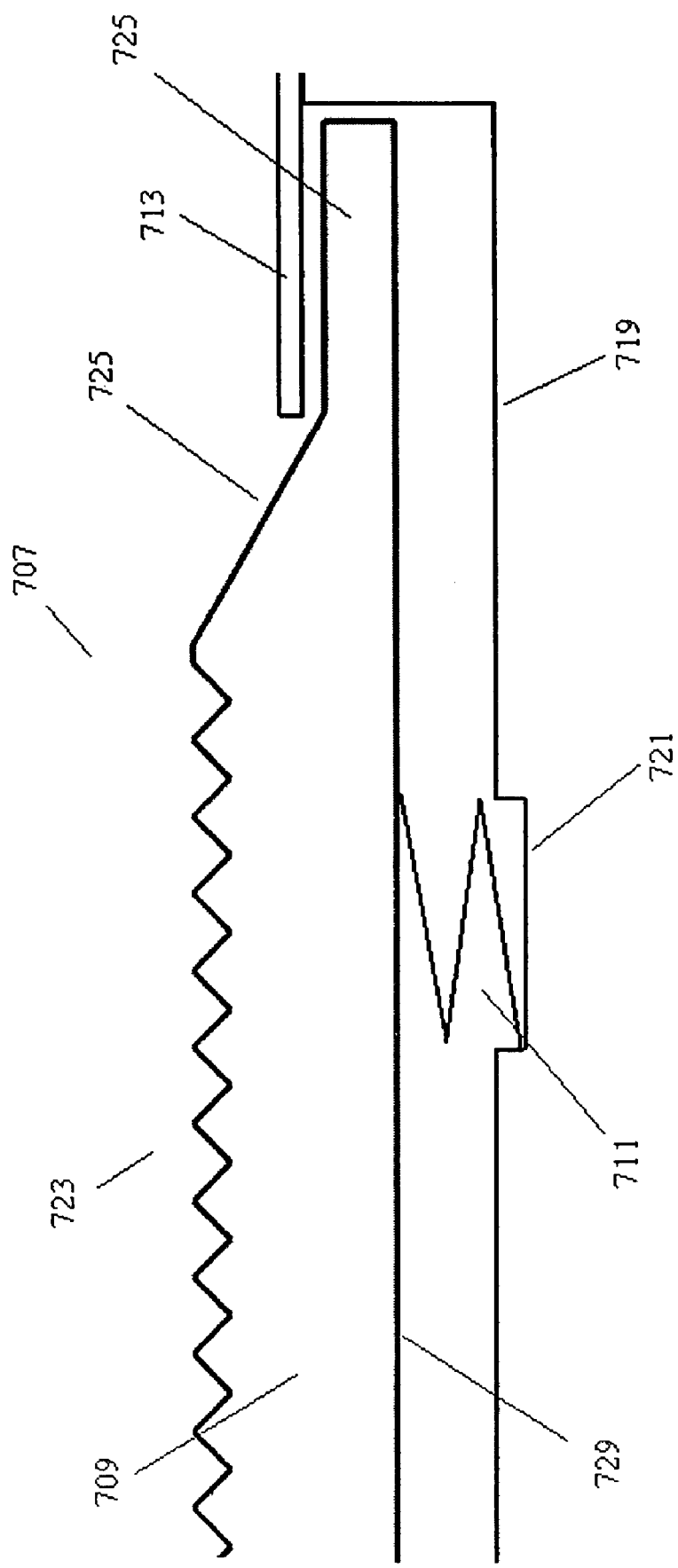
FIG. 8 shows a more detailed view of a portion of the web-material roller of FIGS. 7A and 7B.

FIGS. 7A, 7B, and 8 illustrate an example web-material roller 700 that may be used, for example as one or both of supply roller 503 and take-up roller 507. FIG. 7A illustrates a length of the web-material roller 700 with a cut-away portion to illustrate an internal portion of the web-material roller 700, and FIG. 7B illustrates a cross section of the web-material roller 700. FIG. 8 illustrates an example protrusion element in an example slot of the web-material roller 700 in detail.

The web-material roller 700 may include a shaft 701 having a cylindrical outer surface 703 and one or more slots, each indicated at 705, into which respective spring-loaded protrusion elements, each indicated at 707, may be disposed. The spring-loaded protrusion elements 707 may each include a spur, each indicated at 709, that extend beyond the cylindrical outer surface 703 of the shaft 701 to resiliently engages a web-material core and one or more springs, each indicated at 711, which apply outward force on each spur 709 so that the spurs 709 resiliently engage said web-material cores around the shaft, an example core being designated by dashed lines and at 733 in FIG. 7B. One or more collars 713 may couple the spring-loaded protrusion elements 707 to the shaft 701.

The shaft 701 may be long and thin with dimensions to fit within a web-material core and the stencil wiper assembly 401. In some implementations, the shaft 701 may have a diameter of approximately sixteen millimeters, and the shaft may be approximately sixty-four millimeters long, including two end portions. In some implementations the shaft may be constructed from aluminum or any other desired material. It should be understood that the invention is not limited to any set of dimensions or materials of the shaft 701.

Each end of the shaft 701 may include an end portion 715, 717 that, in some embodiments, may be used to couple the shaft 701 to the stencil wiper assembly 401 (e.g., to the web-material drive 601). In some embodiments, one end portion 715 may include a connection mechanism that comprises a well-known dowel pin configured to engage the web-material drive 601 or any other desired mechanism for axially rotating the shaft 701 to dispense and/or receive web-material to/from a core engaged by the web-material roller 700. In some embodiments, the other end portion 717 of the web-material roller 700 may be a smooth cylinder that may be positioned in the stencil wiper assembly 401 to rotate along with the shaft 701, and may be disengaged from the stencil wiper assembly 401 for easy changing of web-material cores/ rolls.

In some embodiments, as mentioned above, the shaft 701 may include a slot 705 for each of the one or more spring-loaded protrusion elements 707 coupled to the shaft 701. In the illustrated embodiment, the shaft 701 includes three such slots 705. In one embodiment, each slot 705 may be approximately five millimeters wide, approximately two hundred seven millimeters long, and approximately three millimeters deep measured at its deepest location. Each slot 705 may include a flat inner surface 719 and flat side walls 721 configured to hold a respective spring-loaded protrusion element 707 in place.

In some implementations, each slot 705 of the shaft 701 may also include one or more spring recesses 721. Each spring recess 721 may include a hole drilled into the shaft 701 deeper than the rest of a respective slot 705. In some implementations, each spring recess may be approximately four millimeters deep measured at a deepest portion (rather than approximately three millimeters for the rest of the slot 705), and have a diameter to prevent a spring from moving out of the spring recess 721. In one implementation, each spring recess may have an approximately eight millimeter diameter. It should be understood that the invention is not limited to any particular arrangement of a slot and the illustrated embodiment is given as an example only.

The illustrated embodiments of FIGS. 7A, 7B, and 8 include three protrusion elements, each indicated at 707 and associated with respective slots 705. The spring-loaded protrusion elements 707 may be configured and arranged such that a web-material core (e.g., a supply roll core or a disposal core) may resiliently engage the web-material roller 700. In some embodiments, the spring-loaded protrusion elements may be approximately evenly distributed about a circumference of the shaft 701. In some embodiments, the spring-loaded protrusion elements 707 may increase an effective diameter of the web-material roller 700 by extending beyond the cylindrical outer surface 703 of the shaft 701 and may be compressible towards a center of the shaft into a respective slot 705 to reduce the effective diameter of the web-material roller 700, as described in more detail below.

In some embodiments, each spring-loaded protrusion element 707 may include a spur 709 that includes an engaging portion 723, a taper portion 725, locking portions 727, and a base 729, each of which is described in more detail below. The spurs 709 may each be positioned within a respective one of the slots 705 of the shaft 701 so that the locking portions 727 are at each end of the slot 705, the engaging portion 723 faces away from a center of the shaft 701, the taper portion 725 gradually connects the locking portion 727 to the engaging portion 723 and the base 729 faces inward toward the flat inner surface 719 of the slot 705. The taper portion 725 may allow for easy addition of new cores to the web-material roller, the engaging portion may extend beyond the cylindrical outer surface 703 of the shaft 701 to engage the core 733 during operation, the locking portion may couple the spring-loaded protrusion element to the shaft, and the base may provide an interface for a spring, as described below.

As mentioned above, in some embodiments, to hold the spring-loaded protrusion element 707 in proximity to the shaft 701, the web-material roller 700 may include a collar 713 on each side of the spurs 709. In some embodiments, the spurs 709 may be placed in respective slots 705 with locking portions 727 at each side of the respective slots 705. The locking portions 727 may be sized so that the locking portions do not protrude passed the outer cylindrical outer surface 703 of the shaft 701 when the spurs 709 are in the respective slots 705. The collars 713 may be positioned over the locking portions 727 of the spurs 709. The locking portions 727 may thereby be held in the slots 705 by the collars 713 so that the spring-loaded protrusion elements 707 may not be removed from the slots 705. In some implementations, the collars 713 may be coupled to the shaft 701 with one or more bolts, set screws, and/or other connectors, each indicated at 731. In some implementations, the collars 713 may be constructed from a thin piece of aluminum.

In some implementations, each spur 709 may be constructed from a cold-rolled steel coated in nickel. In other implementations, the spurs 709 may be constructed from carbide, stainless steel, aluminum, or any other desired material.

In some implementations, the spurs may be approximately two hundred six millimeters long, including the engaging, taper, and locking portions 723, 725, and 727. In some implementations, the locking portions 727 may be approximately six millimeters long and have an approximate height of 1.5 millimeters, and the engaging portion may be approximately two hundred millimeters long and have an approximate height of 4.3 millimeters at a largest portion. In some embodiments, the spur may be shaped generally as a right triangle. The bottom of the triangle (i.e., the portion of the triangle facing the center of the shaft 701) may form the base 729 of the spur 709. The tip of the triangle facing outward away from the center of the shaft may form the engaging portion 723. In some embodiments, the tip of the engaging portion 723 may include a serrated edge to improve grip of the core 733. In some implementations, the serrations may have a spacing, from tip to tip of approximately 1.6 millimeters. In some implementations, the serrations may have a depth of approximately 0.8 millimeters. In some implementations, the taper portion 725 may gradually change height to connect the engaging portion and the locking portions over a length of approximately five millimeters and at an angle of approximately thirty degrees for a horizontal. It should be understood that the described implementations are given as examples only and that the invention is not limited to any particular arrangement or design of a spur 707.

In some embodiments, the spurs 709 may be configured to penetrate a portion of an interior of a web-material core. In implementations in which the spurs 709 include a serrated engaging portion 723, the edges of the serration may be configured to penetrate a portion of the interior surface of a web-material core. The size and angel of the serrations may be configured to limit the extent of the penetration to the web-material core to prevent damage to the web-material wrapped around the core. In one implementation, the sides of each serration may have an angle of approximately forty-five degrees from a horizontal. Web-material cores are typically constructed from cardboard that may be easily penetrated. Some web-materials include a smooth coating on the interior of the web-material core, which may increase slippage of the core relative to traditional web-material rollers even if the cores fit firmly around such rollers. By penetrating a portion of the interior of the core with the spurs, such slippage may be reduced or eliminated.

In some implementations, each spring-loaded protrusion element 707 may include at least one spring 711, as mentioned above. The spring 711 may be arranged such that one end of the spring 711 is coupled to an inner surface of a respective spring recess 721 to hold the spring 711 in place. Each spring 711 may be arranged such that the second end of the spring 711 is disposed against a base 729 of a respective spur 709. In such an arrangement, each spur 709 may be configured to move toward and away from the center of the shaft 701 within a respective slot 705 thereby decompressing the spring 711 as the spur 709 moves. Compression of the spring 711 may cause an increasing force to be exerted outward away from the center of the shaft 701. In some implementations a stainless steal spring with part number LC 022D 00 S from Lee Spring of New York, N.Y. may be used.

In some implementations, as shown in FIG. 7A, each spring-loaded protrusion element 707 may include two springs, each indicated at 711. The springs 711 may be arranged so that the springs 711 are disposed at opposite sides of a respective spur 709. By positioning the springs 711 as such, the spur 709 may move more evenly and be more stable within the slot 705. It should be understood that the invention is not limited to any particular arrangement of springs and spurs with a slot and that the illustrated embodiments are given as examples only.

In some embodiments, an arrangement of slots 705 and spring-loaded protrusion elements 707 may allow the spurs 709 to be compressed towards a center of the shaft to decrease an effective diameter of the web-material roller 700 and to expand outward to increase an effective diameter of the web-material roller 700. The springs 711 may apply outward force on the spurs 709 so that the spurs have an outward bias apply a force onto web-material cores surrounding the web-material roller 700 when compressed. The spur indicated by 709A in FIG. 7B illustrates a spur that has been compressed inward toward a center of the shaft by the core 733.

In some embodiments, the spurs 709 of each spring-loaded protrusion element 707 may be rotatably coupled to the shaft 701 within a respective slot 705. For example, the spurs 709 shown in FIG. 7B may rotate within the slots 705 in a clockwise fashion so that a tip of the base 729 of each spur 709 may move toward a flat inner surface 719 of each respective slot 705. Such rotation may allow each respective spring 711 to be further compressed thereby causing a greater force to be exerted outward from the center of the shaft 701 to further engage a web-material core around the web-material roller 700. In some implementations, such increased force may also cause the spurs to further penetrate a web-material core. The spur indicated by 709B in FIG. 7B illustrates a spur that has been rotated with a respective slot and penetrates a portion of the core 733 to fully engage the core 733.

In operation, the web-material roller 700 may be used in association with three functions: removal of a core, addition of a new core, and engagement with a web-material core during operation of a stencil wiper assembly 401. Each function is described in turn below with reference to the web-material roller embodiments shown in FIGS. 7A, 7B, and 8. Typical web-material cores may be made from cardboard and have a hollow inner portion with a diameter slightly larger than the shaft 701 so that the cores may be moved along the shaft 701 to be engaged by the spring-loaded protrusion elements 707. Due to manufacturing differences, such cores may vary slightly in size.

To place a new core on an empty web-material roller, the new core may be positioned so that a portion of the shaft 701 is within an internal section of the new core. The new core may be axially applied along the shaft 701 toward the taper portion 725 of the spurs 709. When the new core reaches the taper portion 725, the new core may cause the spurs 709 to compress toward the center of the shaft 701 as the new core is moved along the taper portion 725 toward the engaging portion 723. The spurs 709 thereby act to increase an effective diameter of the web-material roller 700 to engage cores of differing sizes and thereby prevent slippage and other problems associated with cores that are larger than traditional roller shafts.

In some embodiments, the new core and/or the shaft 701 may be rotated in a first direction so that the spring-loaded protrusion elements 707 further engage the new core. For example, to accomplish such further engagement in the illustrated embodiment, the shaft in FIGS. 7A and 7B may be rotated counterclockwise. The counterclockwise rotation of the shaft 701 may cause a force applied to the spurs 709 to rotate the spurs 709 clockwise within their respective slots 705. The spurs 709 may rotate within the slot 705 so that a tip of the base 729 of each spur 709 rotates toward a respective flat inner surface 719 of a respective slot 705. As the spurs 709 rotate, the springs 711 may further compress thereby applying an increasing force outward against the spurs 709 and further engaging the new core. The spurs 709 may continue to rotate within the slots 705 until the force of the springs 711 and the force applied to rotate the spurs 709 reaches an equilibrium or the tip of the base 729 of each spur 709 reaches the flat inner surface 719. In some implementations each spring 711 may exert approximately two pounds of force to engage a core when initial engagement takes place and approximately three pounds of force when fully engaged. It should be understood that the force exerted by the springs 711 may vary in different embodiments of the invention and based on the type and arrangement of springs and other elements and the size of the new cores.

During operation of the stencil wiper assembly 401, the shaft 701 may be rotated with the spurs 709 engaging a web-material core. For example, in the embodiment of FIG. 7B, the shaft may be rotated counterclockwise during operation. The force exerted by the spurs 709 may cause the web-material core to rotate along with the shaft 701. Because of the spring-loaded nature of the spring-loaded protrusion elements 707, core of varying sizes may be engaged and rotated with the shaft 701, without slipping. In some implementations in which web-material roller 700 is used as a supply roller of a stencil printer, the spurs 709 may also apply a stopping force on a roll of web-material to stop the roll of web-material from supplying excess web-material. Such supplying of excess web-material may occur, for example if a supply roll of web-material slips relative to a web-material roller 700 and continues to rotate after a web-material roller has stopped rotating. The spurs 709 in some implementations, may decrease or eliminate such slippage thereby reducing the excess supplying of web-material. For example, in some implementations, the spurs 709 may penetrate a core of a supply roll thereby preventing the supply roll from rotating with the web-material roller 700.

To remove a used core from the web-material roller, the shaft 701 of the used core may be rotated in a second direction so that the spurs 709 return to an initial engagement position, thereby decreasing the force engaging the core to the shaft. In the illustrated embodiment of FIG. 7B, the core may be rotated clockwise so that the spurs rotate counterclockwise within the respective slots. The core may then be axially removed off the shaft 701 in the direction the core was applied to the shaft. As the core is removed, the spurs 709 may move outward to return to an initial position for engagement of another core.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

The invention claimed is:

1. A stencil printer comprising:
   a stencil;
   a material applicator to apply material on the stencil;
   a supply roller configured to receive a roll of web-material, the supply roller being selectively configured to comprise a first shaft having a cylindrical outer surface and selectively configured to have at least one slot formed therein and at least one recess formed in the at least one slot;
   a take-up roller to receive used web-material, the take-up roller being selectively configured to comprise a second shaft having a cylindrical outer surface and selectively configured to have at least one slot formed therein and at least one recess formed in the at least one slot;
   at least one spring-loaded protrusion element associated with one of the first shaft and the second shaft, the at least one spring-loaded protrusion element having a spur disposed in the at least one slot, a compression coil spring disposed in the at least one recess, and a collar to couple the spur to one of the first shaft and the second shaft, the spur including an engaging portion, a taper portion, an end locking portion captured by the collar, and a base configured to be seated within the at least one slot, the engaging portion of the spur of the at least one spring-loaded protrusion element being configured and arranged to resiliently engage at least one web-material core around which web-material may be disposed in such a manner that the engaging portion of the spur is configured to rotate in a first direction to increase a force exerted to resiliently engage the web-material core when the at least one of the first shaft and the second shaft is rotated in at least one second direction;
   a drive configured to move web-material across the stencil between the supply roller and the take-up roller; and
   a frame to support the supply roller, the take-up roller and the drive.

2. The stencil printer of claim 1, wherein the at least one spring-loaded protrusion element is configured to resiliently engage the at least one web-material core by penetrating at least a portion of an interior of the at least one web-material core with the engaging portion of the spur.

3. The stencil printer of claim 1, wherein the engaging portion of the spur includes a serrated engagement portion.

4. The stencil printer of claim 1, wherein the spring is arranged to exert a force on the spur away from a center of the at least one of the first shaft and the second shaft.

5. The stencil printer of claim 4, wherein the spur and the spring are arranged so that the spring may be compressed toward the center of the at least one of the first shaft and the second shaft to decrease an effective diameter of the at least one cylindrical surface.

6. The stencil printer of claim 1, wherein the at least one of the first shaft and the second shaft includes both the first shaft and the second shaft.

* * * * *